(12) United States Patent
Hasegawa et al.

(10) Patent No.: US 7,423,724 B2
(45) Date of Patent: Sep. 9, 2008

(54) EXPOSURE APPARATUS AND DEVICE MANUFACTURING METHOD

(75) Inventors: Noriyasu Hasegawa, Utsunomiya (JP); Tatsuya Hayashi, Utsunomiya (JP); Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 265 days.

(21) Appl. No.: 11/387,682

(22) Filed: Mar. 24, 2006

(65) Prior Publication Data
US 2006/0215137 A1 Sep. 28, 2006

(30) Foreign Application Priority Data
Mar. 25, 2005 (JP) .............................. 2005-088934

(51) Int. Cl.
*G03B 27/42* (2006.01)
*G03B 27/52* (2006.01)

(52) U.S. Cl. .......................................... 355/53; 355/30

(58) Field of Classification Search .................. 355/53, 355/30, 72, 75; 417/423.4; 414/935
See application file for complete search history.

(56) References Cited

U.S. PATENT DOCUMENTS

| 6,198,792 | B1 | 3/2001 | Kanouff et al. | 378/34 |
| 6,369,874 | B1 | 4/2002 | del Puerto | 355/30 |
| 6,459,472 | B1 | 10/2002 | De Jager et al. | 355/68 |
| 6,721,032 | B2 | 4/2004 | Hasegawa et al. | 355/30 |
| 6,801,301 | B2 | 10/2004 | Miyajima et al. | 355/72 |
| 6,954,255 | B2 | 10/2005 | Hasegawa et al. | 355/30 |
| 7,123,343 | B2 | 10/2006 | Hasegawa et al. | 355/30 |
| 7,130,016 | B2 | 10/2006 | Miyajima | 355/30 |
| 2002/0191166 | A1* | 12/2002 | Hasegawa et al. | 355/53 |
| 2005/0069433 | A1* | 3/2005 | Hayashi | 417/423.4 |
| 2005/0128446 | A1 | 6/2005 | Miyajima | 355/30 |
| 2005/0140947 | A1 | 6/2005 | Miyajima | 355/30 |
| 2006/0114433 | A1 | 6/2006 | Miyajima et al. | 355/53 |
| 2006/0192930 | A1 | 8/2006 | Iimura et al. | 355/53 |
| 2006/0209281 | A1 | 9/2006 | Hayashi | 355/53 |
| 2006/0215137 | A1 | 9/2006 | Hasegawa et al. | 355/53 |
| 2006/0274292 | A1 | 12/2006 | Hasegawa et al. | 355/30 |

FOREIGN PATENT DOCUMENTS

JP 2000-58443 2/2000

* cited by examiner

*Primary Examiner*—Peter B Kim
(74) *Attorney, Agent, or Firm*—Fitzpatrick, Cella, Harper & Scinto

(57) ABSTRACT

An exposure apparatus exposes a substrate to light via a reticle in a vacuum. A projection optical system projects a pattern of the reticle onto the substrate, a stage holds the substrate and moves, and first and second partitions define an exhaust space between a first space accommodating at least a part of the projection optical system and a stage space accommodating the stage. The first partition includes a first opening to make the light pass between the first space and the exhaust space, and the second partition includes a second opening to make the light pass between the exhaust space and the stage space. A first supply system supplies fluid into the stage space, and a first exhaust system recovers fluid from the stage space through the second opening and the exhaust space. A pressure in the exhaust space is lower than those in the first space and the stage space.

19 Claims, 11 Drawing Sheets

EXPOSURE APPARATUS AND DEVICE MANUFACTURING METHOD

This application claims the benefit of Japanese Patent Application No. 2005-088934, filed Mar. 25, 2005, which is hereby incorporated by reference herein in its entirety.

FIELD OF THE INVENTION

The present invention relates to an exposure apparatus for exposing a substrate to light via a reticle in a vacuum atmosphere, and a device manufacturing method using the exposure apparatus.

BACKGROUND OF THE INVENTION

Reduction projection exposure using ultraviolet light has conventionally been performed as a printing (lithography) method of manufacturing a fine semiconductor element, such as a semiconductor memory or logic circuit.

The minimum size capable of transfer by reduction projection exposure is proportional to the wavelength of light used for the transfer and inversely proportional to the numerical aperture of the projection optical system. To transfer a fine circuit pattern, the wavelength of exposure light for use is being shortened. The wavelength of ultraviolet rays for use is becoming shorter, to a mercury-vapor lamp i-line (wavelength: 365 nm), a KrF excimer laser beam (wavelength: 248 nm), and an ArF excimer laser beam (wavelength: 193 nm).

However, as semiconductor elements rapidly shrink in feature size, there is a limit to lithography using the above-described ultraviolet light. To efficiently print a very fine circuit pattern, smaller than 0.1 μm, a reduction projection exposure apparatus using extreme ultraviolet light (EUV light) whose wavelength is much shorter than the above-described ultraviolet light, i.e., as short as about 10 to 15 nm, is being developed.

Light in the EUV wavelength region is greatly absorbed by a substance. The use of an optical lens system, which utilizes light refraction and matches a visible light region, or the wavelength region of the above-described ultraviolet light, is not practical, and a reflecting optical system is adopted. A reticle is a reflective reticle on which a pattern to be transferred onto a mirror is formed by an absorber.

Reflecting optical elements, which form the exposure apparatus using EUV light include a multilayer mirror and an oblique incidence total reflection mirror. The real part of the refractive index of a mirror material with respect to light in the EUV wavelength region is slightly smaller than one. Therefore, to allow the mirror surface to totally reflect EUV light, it must be applied to the reflecting surface of the mirror at a small incidence angle. In general, oblique incidence at several degrees from the reflecting surface provides a high reflectance of several tens of percent or more. However, since the degree of freedom in optical design is low, it is difficult to use the total reflection mirror in the projection optical system.

An EUV light mirror, which receives EUV light at an incidence angle almost close to normal incidence is a multilayer mirror obtained by alternately stacking, on the reflecting surface, two types of substances having different optical constants. Molybdenum and silicon are alternately stacked on the surface of a glass substrate polished into a precisely planarized state. The layer thickness is, e.g., 0.2 nm for the molybdenum layer and about 0.5 nm for the silicon layer. The number of stacked layers is about twenty pairs. A value as the sum of the thicknesses of layers of the two types of substances will be called a film cycle. In this example, the film cycle is 0.2 nm+0.5 nm=0.7 nm.

When EUV light is applied to the multilayer mirror, EUV light having a specific wavelength is reflected.

Letting $\theta$ be the incidence angle, $\lambda$ be the wavelength of EUV light, and $d$ be the film cycle, only EUV light with a narrow bandwidth centered on $\lambda$, which approximately satisfies Bragg's equation:

$$2 \times d \times \sin\theta = \lambda$$

is efficiently reflected. At this time, the bandwidth is about 0.6 to 1 nm.

The reflectance of a multilayer mirror to EUV light is about 0.7 at a maximum, so the light amount loss at each multilayer mirror is very large. EUV light, which is not reflected by the multilayer mirror, is absorbed in the multilayer film or the substrate of the multilayer mirror, and most of the energy is converted into heat. Moreover, the multilayer mirror may expand or deform due to the influence of the heat, resulting in a deterioration in performance of the entire optical system.

To expose a wide exposure region with a minimum number of mirrors, it is proposed to simultaneously scan a reticle (original) and wafer (exposure target) to project and to form, by exposure, a reticle pattern onto the wafer. FIG. 9 shows the structure of a scanning exposure apparatus (a so-called scanner) to cope with this technique. The scanning exposure apparatus is constituted by an EUV light source, an illumination optical system, a reflective reticle, a projection optical system, a reticle stage, a wafer stage, an alignment optical system, and a vacuum system.

As the EUV light source, e.g., a laser plasma source is used. A target material provided by a target providing unit installed outside a vacuum vessel is irradiated with a high-intensity pulse laser beam to generate a high-temperature plasma, and EUV light, which is emitted by the plasma and has a wavelength of, e.g., about 13 nm, is utilized. The target material is a metal thin film, inert gas, droplets, or the like, and is supplied into the vacuum vessel by a means such as a gas jet. To increase the average intensity of emitted EUV light, the repetition frequency of the pulse laser is preferably high. The pulse laser is generally operated at a repetition frequency of several kHz.

The illumination optical system comprises a plurality of multilayer mirrors or oblique incidence mirrors, and an optical integrator. A collection mirror on the first stage collects EUV light almost isotropically emitted from a laser plasma. The optical integrator uniformly illuminates a reticle at a predetermined numerical aperture. An aperture for limiting a region illuminated on the reticle plane to an arcuate shape is formed at a position conjugate to the reticle of the illumination optical system.

The projection optical system uses a plurality of mirrors. A smaller number of mirrors provides a higher EUV light utilization efficiency, but makes aberration correction difficult. The number of mirrors necessary for aberration correction is about four to six. The reflecting surface of the mirror has a convex or concave spherical or aspherical shape. The numerical aperture NA is about 0.1 to 0.2.

The mirror is fabricated by grinding and polishing a substrate made of a material with a high rigidity, a high hardness, and a low thermal expansion coefficient, such as low-expansion-coefficient glass or silicon carbide, into a predetermined reflecting surface shape, and forming multilayer films of molybdenum and silicon on the reflecting surface. If the incidence angle is not constant, depending on the position within the mirror plane, the reflectance of a multilayer film with a predetermined number of film cycles increases depending on the position, shifting the wavelength of EUV light, as is apparent from Bragg's equation. To prevent this, the film cycle distribution must be set such that EUV light having the same wavelength is efficiently reflected within the mirror plane.

The reticle and wafer stages have mechanisms for scanning these stages in synchronism with each other, at a velocity ratio proportional to the reduction magnification. Let X be the scanning direction within the reticle or wafer plane, Y be the direction perpendicular to the scanning direction, and Z be the direction perpendicular to the reticle or wafer plane.

A reticle is held by a reticle chuck on the reticle stage. The reticle stage has a driving mechanism of moving the reticle stage along the X direction at a high speed. The reticle stage also has fine moving mechanisms in the X direction, Y direction, Z direction, and rotational directions around these axes, and can align a reticle. The position and posture of the reticle stage are measured by a laser interferometer, and controlled on the basis of the measurement results.

A wafer is held on the wafer stage by a wafer chuck. The wafer stage has a mechanism of moving the wafer stage along the X direction at a high speed, similar to the reticle stage. The wafer stage also has fine moving mechanisms in the X direction, Y direction, Z direction, and rotational directions around these axes, and can align a wafer. The position and posture of the wafer stage are measured by a laser interferometer, and controlled on the basis of the measurement results.

An alignment detection optical system measures the positional relationship between the reticle position and the optical axis of the projection optical system, and the positional relationship between the wafer position and the optical axis of the projection optical system. The positions and angles of the reticle and wafer stages are set such that a reticle projection image coincides with a predetermined position on a wafer.

The focus position in the Z direction within the wafer plane is measured by a focus position detection optical system, and the position and angle of the wafer stage are controlled. The wafer plane always keeps a position at which the projection optical system images during exposure.

At the end of one scanning exposure on a wafer, the wafer stage moves step by step in the X and Y directions to the next scanning exposure start position. The reticle and wafer stages are sync-scanned again in the X direction at a velocity ratio proportional to the reduction magnification of the projection optical system.

In this way, a sync scanning operation is repeated (step and scan), while the reduction projection image of a reticle is formed on a wafer. As a result, the reticle transfer pattern is transferred onto the entire wafer surface. EUV light is strongly absorbed by a gas. For example, when EUV light having a wavelength of 13 nm propagates 1 m through a space filled with 10-Pa air, the transmittance of the EUV light is about 50%. Similarly, the transmittances of the EUV light upon its propagation by 1 m through spaces filled with 10-Pa gases, e.g., helium, argon, and hydrogen, are about 88%, 71%, and 98%, respectively. In order to avoid EUV light absorption by a gas, the space must be purged with helium with a high transmittance, most of the space where EUV light propagates must be set at a pressure of $10^{-1}$ Pa or less, and preferably, $10^{-3}$ Pa or less, and the partial pressure of gases (e.g., oxygen and water) having low transmittances must be minimized.

When molecules including carbon, such as hydrocarbons, are left in a space where an optical element irradiated with EUV light is arranged, carbon gradually attaches to the surface of the optical element due to light irradiation. The attached carbon absorbs the EUV light to undesirably decrease the reflectance. In order to prevent carbon from attaching to the optical element, the partial pressure of molecules, including carbon in the space where the optical element irradiated with EUV light is arranged, must be kept at $10^{-4}$ Pa or less, and preferably, $10^{-6}$ Pa or less.

An exposure apparatus repeats the following operations. That is, the exposure apparatus loads, from outside, a semiconductor wafer coated with a resist serving as a photosensitive agent. The exposure apparatus scans the semiconductor wafer and a reticle, and transfers the pattern of the reticle onto the semiconductor wafer. The exposure apparatus then unloads the exposed semiconductor wafer. The exposure apparatus includes a large number of driving mechanisms and may cause outgassing by friction to result in a decrease in transmittance of a mirror.

A wafer stage includes driving mechanisms, such as a scanning exposure moving mechanism and a wafer transport mechanism, and has a large surface area. Outgassing cannot be eliminated from a component having such a large surface area. Therefore, it is difficult to set an exposure space in a high vacuum.

The resist applied to the wafer is an organic substance, although it is heated and baked before exposure. When the resist is arranged in a vacuum, an organic substance, which forms the resist, or hydrocarbons, as the decomposed substance, are produced and diffused in the apparatus set in the vacuum. A wafer is loaded from the outer atmosphere to the exposure apparatus. During loading of the wafer, it is difficult to remove, within a short period of time, the air component containing moisture attaching to the wafer. The moisture is gradually desorbed and diffused in the vacuum. It is, therefore, very difficult to maintain the high vacuum due to outgassing from the wafer and the resist.

It is possible to set a high vacuum using a large-capacity vacuum pump, but components in the vacuum space become an issue. That is, molecules including carbon and moisture should not be diffused, particularly in the space in which the mirror and reticle are arranged.

As a countermeasure for protecting the mirror from outgassing from the wafer, or the like, a space is formed to surround the mirror, arranged between the reticle and the wafer, in Japanese Patent Application Laid-Open No. 2000-058433. More specifically, a gas (hydrogen, argon, or krypton), which does not substantially absorb EUV light is blown, for the wafer, toward the side surface of a conical opening formed at the exit of light from the space to the wafer.

Along with operation of the wafer stage, the conductance between the conical opening and the wafer stage changes, to change the amount of inert gas blown to the stage space and the projection optical system space. This leads to instability in the pressure of each space and the exposure amount on the wafer surface. In addition, the inert gas flowing toward the wafer surface makes contaminants diffuse in a chamber which accommodates the wafer stage. This contaminates the sensor surface arranged on the wafer stage.

SUMMARY OF THE INVENTION

The present invention has been made in consideration of the above background, and has as its exemplary object to reduce contamination of components of a projection optical system and a stage.

In order to solve the above problems and to achieve the object, according to the first aspect of the present invention, there is provided an exposure apparatus for exposing a substrate to light via a reticle in a vacuum, comprising a projection optical system configured to project a pattern of the reticle onto the substrate, a stage configured to hold one of the reticle and the substrate and to move, first and second partitions configured to define an exhaust space between a first space, which accommodates at least a part of the projection optical system and a stage space, which accommodates the stage, the first partition including a first opening configured to make the light pass between the first space and the exhaust space, and the second partition including a second opening configured to make the light pass between the exhaust space and the stage space, a first supply system configured to supply fluid into the stage space, and a first exhaust or evacuation system configured to recover fluid from the stage space through the second opening and the exhaust space.

In the above aspect, the first exhaust system is configured to set a pressure in the exhaust space to be lower than those in the first space and the stage space.

In the above aspect, the stage is a substrate stage configured to hold the substrate and to move.

In the above aspect, the apparatus further comprises a reticle stage configured to hold the reticle and to move, a third partition configured to partition a second space which accommodates at least a part of the projection optical system and a reticle stage space which accommodates the reticle stage, the third partition including a third opening configured to make the light pass between the second space and the reticle stage space, and a second exhaust or evacuation system configured to recover a gas from the reticle stage space through the third opening and the second space.

In the above aspect, the second exhaust system is configured to set a partial pressure of gas outgassed in the second space to be lower than a partial pressure of gas outgassed in the reticle stage.

In the above aspect, the apparatus further comprises a fourth partition configured to partition the first space and the second space, the fourth partition including a fourth opening configured to make the light pass between the first space and the second space.

In the above aspect, the second exhaust system is configured to set a pressure in the second space to be lower than that in the first space.

In the above aspect, the first supply system is configured to supply inert gas as the fluid.

In the above aspect, the apparatus further comprises a first sensor configured to measure pressure in the stage space, wherein the first supply system is configured to supply inert gas as the fluid, so as to keep the pressure in the stage space constant based on measurement made by the first sensor.

In the above aspect, the first supply system is configured to supply inert gas into a gap between the second partition and the substrate stage.

In the above aspect, the apparatus further comprises a second sensor arranged on the substrate stage, wherein the first supply system is configured to supply inert gas from a region which surrounds the second sensor.

In the above aspect, the apparatus further comprises a partition configured to surround the second sensor, wherein the first supply system is configured to supply inert gas from a region between the partition and the second sensor.

In the above aspect, the apparatus further comprises a second supply system configured to supply inert gas into the first space.

In the above aspect, the apparatus further comprises a third sensor configured to measure pressure in the first space, wherein the second supply system is configured to supply the inert gas, so as to keep the pressure in the first space constant based on measurement made by the third sensor.

In the above aspect, the apparatus further comprises a chamber configured to define each of the spaces, and a first support configured to support the second partition substantially independently of the chamber.

In the above aspect, the apparatus further comprises a chamber configured to define each of the spaces, and a second support configured to support the first supply system substantially independently of the chamber.

In the above aspect, the apparatus further comprises a cooling mechanism configured to cool the second partition.

In the above aspect, a wavelength of the light is not shorter than 0.5 nm, and not longer than 20 nm.

In the above aspect, pressure in the stage space is higher than 0.1 Pa and lower than 10 Pa.

According to the second aspect of the present invention, there is provided a method of manufacturing a device, comprising steps of exposing a substrate to light via a reticle using an exposure apparatus as defined above, developing the exposed substrate, and processing the developed substrate to manufacture the device.

The present invention can, for example, reduce contamination of the constituent components of a projection optical system and stage.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims, which follow the description for determining the scope of the invention.

DETAILED DESCRIPTION OF THE PREFERRED EMBODIMENTS

Embodiments of the present invention will be described below in detail with reference to the accompanying drawings.

Note that the embodiments to be described hereinafter are examples as implementation means of the present invention, and should be appropriately modified or changed in accordance with various conditions, and the structure of an apparatus to which the present invention is applied.

First Embodiment

Figure 1:
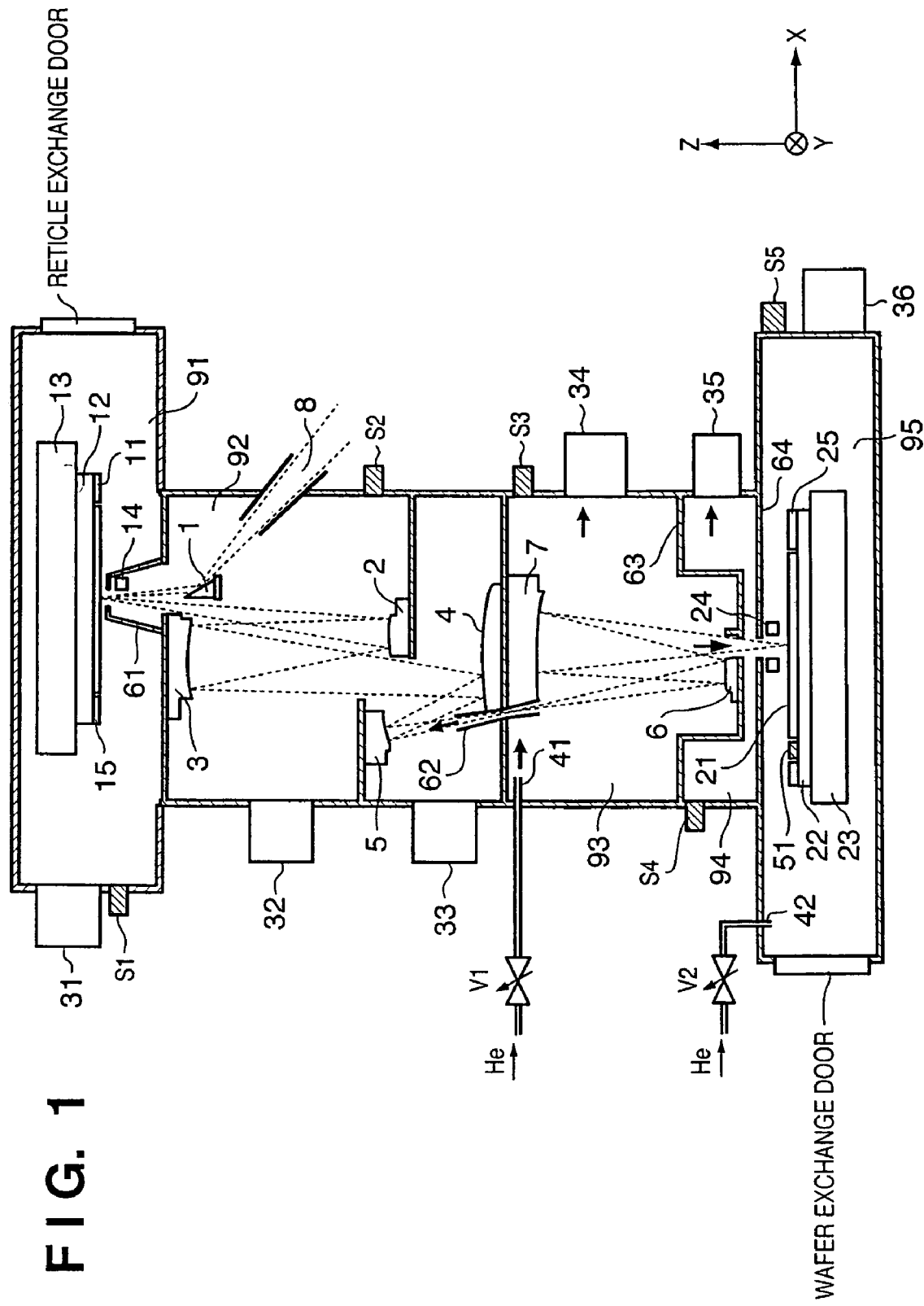
FIG. 1 is a view showing the schematic structure of an EUV exposure apparatus according to the first embodiment of the present invention.

FIG. 1 is a view showing the schematic structure of an EUV exposure apparatus according to the first embodiment of the present invention.

Referring to FIG. 1, reference numeral 8 denotes EUV light; reference numeral 1, a reticle illumination mirror; reference numeral 2, a first mirror of a projection optical system; reference numeral 3, a second mirror of the projection optical system; reference numeral 4, a third mirror of the projection optical system; reference numeral 5, a fourth mirror of the projection optical system; reference numeral 6, a fifth mirror of the projection optical system; reference numeral 7, a sixth mirror of the projection optical system; reference numeral 11, a reflective reticle; reference numeral 12, a reticle holding unit or reticle holder; reference numeral 13, a reticle stage; reference numeral 14, a reticle alignment optical system; reference numeral 21, a wafer; reference numeral 22, a wafer chuck; reference numeral 23, a wafer stage; and reference numeral 24, a wafer alignment optical system.

As the EUV light source, a laser plasma source (not shown) is used. A target material provided by a target providing unit installed outside a vacuum vessel is irradiated with a high-intensity pulse laser beam emitted by an exciting pulse laser to generate a high-temperature plasma, and EUV light, which is emitted by the plasma and has a wavelength of, e.g., about 13 nm, is utilized. Light with a wavelength of 0.5 nm to 20 nm may be adopted as EUV light. The target material is a metal thin film inert gas, droplets, or the like, and is supplied into the vacuum vessel by a means such as a gas jet. To increase the average intensity of emitted EUV light, the repetition frequency of the pulse laser is preferably high. The pulse laser is generally operated at a repetition frequency of several kHz.

An illumination optical system (not shown) comprises a plurality of multilayer mirrors or oblique incidence mirrors, and an optical integrator and uniformly illuminates a reticle at a predetermined numeral aperture.

The projection optical system uses a plurality of mirrors. A smaller number of mirrors provides a higher EUV light utilization efficiency, but makes aberration correction difficult. The number of mirrors necessary for aberration correction is about four to six. The reflecting surface of the mirror has a convex or concave spherical, or an aspherical shape. The numeral aperture NA is about 0.1 to 0.2.

The mirror is fabricated by grinding and polishing a substrate made of a material with a high rigidity, a high hardness, and a low thermal expansion coefficient, such as low-expansion-coefficient glass or silicon carbide, into a predetermined reflecting surface shape, and forming multilayer films of molybdenum and silicon on the reflecting surface.

The reticle stage 13 and wafer stage 23 have mechanisms of scanning these stages in synchronism with each other at a velocity ratio proportional to the reduction magnification. Let X be the scanning direction within the reticle or wafer plane, Y be the direction perpendicular to the scanning direction, and Z be the direction perpendicular to the reticle or wafer plane.

The reticle 11 is held by the reticle chuck 12 on the reticle stage 13. The reticle stage 13 has a driving mechanism of moving the reticle stage along the X direction at a high speed. The reticle stage 13 also has fine moving mechanisms in the X direction, Y direction, and rotational directions around these axes, and can align the reticle 11. The position and posture of the reticle stage 13 are measured by a laser interferometer (not shown), and controlled on the basis of the measurement results.

The wafer 21 is held on the wafer stage 23 by the wafer chuck 22. The wafer stage 23 has a mechanism of moving the wafer stage along the X direction at a high speed, similar to the reticle stage 13. The wafer stage also has fine moving mechanisms in the X direction, Y direction, Z direction, and rotational directions around these axes, and can align the wafer 21. The position and posture of the wafer stage 23 are measured by a laser interferometer (not shown), and controlled on the basis of the measurement results.

The alignment detection mechanism 14 measures the positional relationship between the reticle position and the optical axis of the projection optical system, and the positional relationship between the wafer position and the optical axis of the projection optical system. The positions and angles of the reticle stage 13 and wafer stage 23 are set such that a reticle projection image coincides with a predetermined position on the wafer.

The focus position in the Z direction within the wafer plane is measured by the focus position detection mechanism 24, and the position and angle of the wafer stage are controlled. The wafer plane always keeps a position at which the projection optical system images during exposure.

At the end of one scanning exposure on the wafer 21, the wafer stage 23 moves step by step in the X and Y directions to the next scanning exposure start position. The reticle stage 13 and wafer stage 23 are sync-scanned again in the X direction at a velocity ratio proportional to the reduction magnification of the projection optical system.

In this way, sync scanning operation is repeated (step and scan), while the reduction projection image of a reticle is formed on a wafer. As a result, the reticle transfer pattern is transferred onto the entire wafer surface.

The exposure apparatus can generate a spatially differential pressure, while accommodating a partition and stop having an opening to transmit exposure light.

<Reticle Stage and First Optical Path Space>

In this embodiment, a shielding member (partition) 61 is arranged between a reticle stage space 91 and a first optical path space 92. The reticle stage space 91 surrounds the reticle and reticle stage. The first optical path space 92 surrounds the first to third mirrors of the projection optical system. The partition 61 has an opening to transmit illumination light, which illuminates the reticle, exposure light, which emerges from the reticle, and alignment light. The gap (in this embodiment, the gap between the shielding member and the reticle surface is controlled to 1 mm or less), between the reticle stage space 91 and the first optical path space 92, which provides the ability to guide and to move a gas, is set to be 1 mm or less to generate a differential pressure between the reticle space and the first optical path space.

As the reticle stage space 91 is connected to an exhauster 31, such as a turbo-molecular pump, it can be maintained at a predetermined pressure. A pressure sensor or pressure gauge S1 can monitor the pressure in the space. As the first optical path space 92 is connected to exhausters 32 and 33, it can be maintained at a predetermined pressure. A pressure sensor or pressure gauge S2 can monitor the pressure in the space.

If the partial pressures of outgassing from the reticle stage space 91 and first optical path space 92 are defined as P91 and P92, respectively, the following conditional inequality holds:

$$P92<P91. \tag{1}$$

With this arrangement, a differential pumping system is formed between the reticle stage space 91 and the first optical path space 92. This makes it possible to suppress the amount of outgassing, which enters into the first optical path space 92, upon being generated from the reticle stage space 91. Although the two exhausters are prepared in this case, one or three or more exhausters may be prepared.

<First Optical Path Space and Second Optical Path Space>

In this embodiment, an aperture member 62, which corresponds to the above-described shielding member, is also arranged between the first optical path space 92 and a second optical path space 93. The aperture number 62 forms the exit from the first optical path space 92 and the entrance to the second optical path space 93 for exposure light, which has passed through the first optical path space 92, upon emerging from the reticle. An opening of the aperture member 62 connects the first optical path space and the second optical path space, to generate a differential pressure between the two spaces. An exhauster 34 is connected to the second optical path space. A pressure sensor or pressure gauge S3 monitors the pressure in the second optical path space 93.

The pressure of the first optical path space 92 is set to be lower than that of the second optical path space 93 by using the exhausters and the detection results obtained by the pressure sensors. That is, if the pressures of the first optical path space 92 and second optical path space 93 are defined as P92 and P93, respectively, the following conditional inequality holds:

$$P92<P93 \tag{2}$$

A gas supply unit to supply an inert gas, such as helium, is arranged in the second optical path space 93. Helium is supplied from a nozzle 41 to the second optical path space 93 through a valve V1. One or a plurality of valves and nozzles to supply an inert gas may be prepared. Furthermore, the inert gas to be supplied is not limited to helium, and may be nitrogen, hydrogen, argon, or krypton.

<Second Optical Path Space, Exhaust Space, and Wafer Stage Space>

An exhaust or evacuation space 94 is formed between the second optical path space 93 and a wafer stage space 95 by using partitions 63 and 64 having an opening to transmit exposure light. An exhauster 35 is connected to the exhaust space 94. A pressure sensor or pressure gauge S4 monitors the pressure in the exhaust space 94. An exhaust 36 is connected to the wafer stage space 95. A pressure sensor or pressure gauge S5 monitors the pressure in the wafer stage space 95.

A gas supply unit to supply an inert gas, such as helium, is arranged in the wafer stage space 95. Helium is supplied from a nozzle 42 to the wafer stage space 95 through a valve V2. The supply amount of helium is controlled so that a pressure sensor or pressure gauge S5 detects an almost constant pressure. One or a plurality of valves and nozzles to supply an inert gas may be prepared. Furthermore, the inert gas to be supplied is not limited to helium, and may be nitrogen, hydrogen, argon, or krypton.

The contaminants produced from the resist on the wafer surface during exposure attach to the surface of an exposure amount measurement sensor 51 arranged on the wafer stage 23, and disturb accurate measurement. To solve this problem, helium is supplied from the nozzle 42 to the wafer stage space 95 through the valve V2, and the helium supplied from the nozzle 42 is partially exhausted by the exhauster 36. Another part of the helium passes between the wafer 21 and the partition 64, flows into the exhaust space 94 through an opening of the partition 64, and is exhausted by the exhauster 35 in the exhaust space 94. The irradiation region of exposure light is present at the opening of the partition 64. Therefore, the supplied helium flows from the peripheral portion of the opening toward the opening, and most of the contaminants produced during exposure flows into the exhaust space 94 and second optical path space 93 without entering the wafer stage space 95.

As described above, the exposure amount measurement sensor 51 arranged on the wafer stage can also be protected against the contaminants produced from the resist on the wafer surface during exposure.

Helium is supplied from the nozzle 41 to the second optical path space through the valve V1, and the supplied helium is partially exhausted by the exhauster 34. Another part of the helium flows into the first optical path space via the aperture member 62, and a portion thereof is exhausted by the exhauster 35 in the exhaust space 94 through an opening of a partition 63. At this time, the contaminants flowing from the wafer stage space 95 are pushed by the flow from the second optical path space 93 and recovered by the exhauster 35 in the exhaust space 94, without rarely entering into the second optical path space 93. The supply amount of helium is so controlled that the pressure sensor S3 detects an almost constant pressure. At this time, when the pressure in the wafer stage space 95 is controlled to 0.1 to 10 Pa, it is possible to suppress the contaminants produced from the wafer surface during exposure from diffusing in the wafer stage space. The pressure in the wafer stage space 95 is preferably higher than 0.1 Pa, to enhance a suppression effect, and preferably, lower than 10 Pa, to maintain a high transmittance.

Similarly, when the pressure in the second optical path space 92 is controlled to 0.1 to 10 Pa, it is possible to suppress the contaminants produced from the wafer surface during exposure from entering the second exposure space or first exposure space. The pressure in the second optical path space 93 is preferably higher than 0.1 Pa, to enhance a suppression effect, and preferably, lower than 10 Pa, to maintain a high transmittance.

If the pressures of the second optical space 93, exhaust space 94, and wafer stage space 95 are defined as P93, P94, and P95, respectively, the following conditional inequality holds:

$$P94<P93,P95 \tag{3}$$

The projection optical system is defined as the first and second optical path spaces 92 and 93 from the reticle side in the light propagation order, and the space which surrounds the wafer stage is defined as the wafer stage space. When exposure is performed while satisfying the relationship of the pressures given by conditional inequality (3), the contaminants produced from the wafer surface (resist) can be prevented from attaching to the mirror surface. The supply amount of helium is controlled so that the pressure sensors S3 and S5 detect almost constant pressures. The change in exposure light intensity, which is caused by a change in pressure depending on the change in conductance between the wafer surface and the partitions upon operation of the wafer stage, can be suppressed Differential pumping has been described as a method of suppressing outgassing in the reticle stage space in this embodiment. A similar measure to the wafer stage space may be taken between the reticle stage space 91 and the first optical path space 92. In this case, although the exposure light transmittance is reduced due to an increase in pressure of the whole optical path space, outgassing present in the reticle stage space can be prevented from entering into the optical path space 92, as in differential pumping.

This embodiment has described a case in which the contaminants produced from the resist on the wafer surface during exposure are suppressed from entering into the space. This measure is not limited to only an exposure operation, because contaminants are always produced more or less during operation, except for the exposure operation.

Second Embodiment

Figure 2:
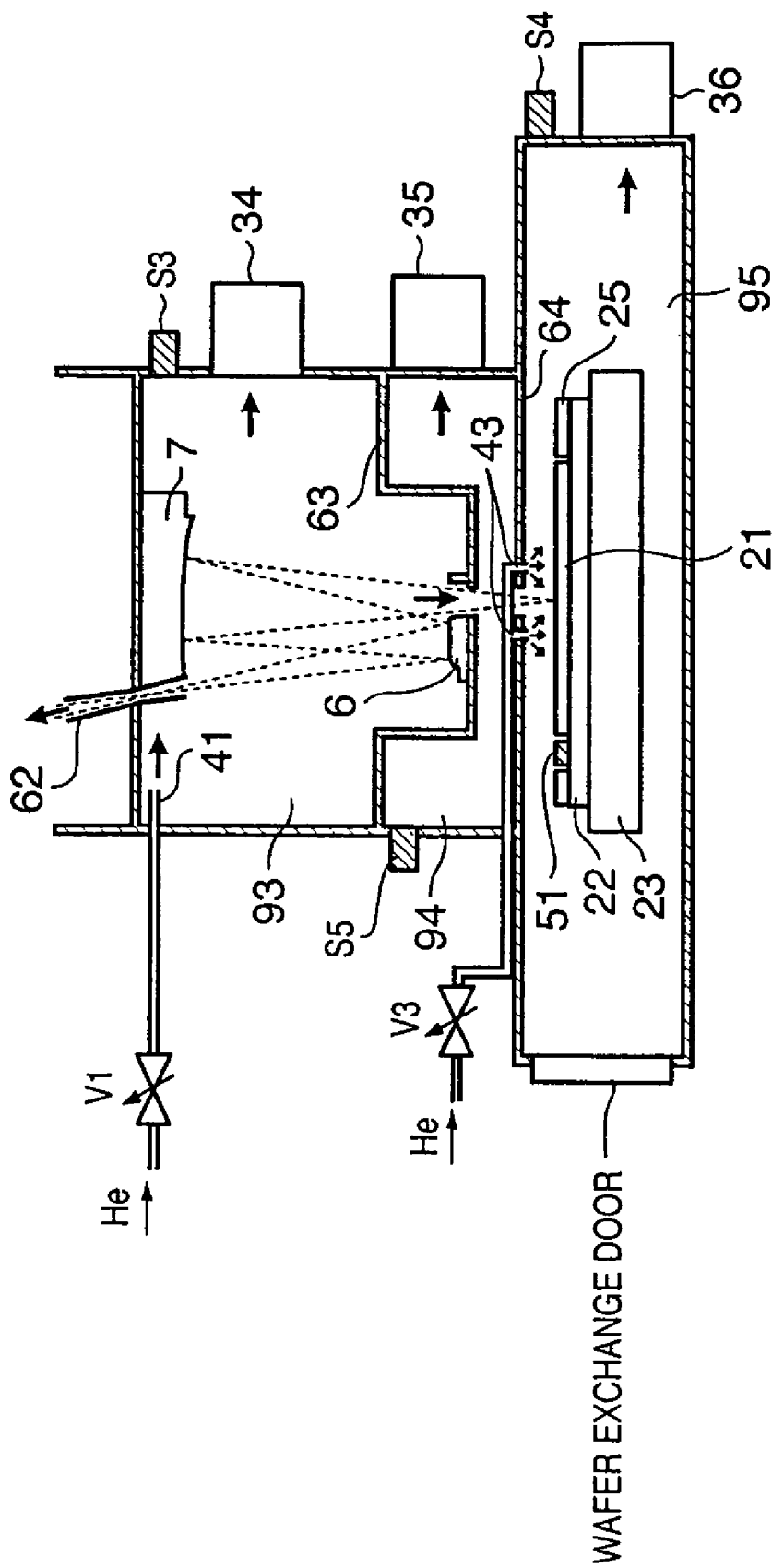
FIG. 2 is an enlarged view showing the vicinity of a fifth mirror of a projection optical system in an EUV exposure apparatus according to the second embodiment of the present invention.

FIG. 2 shows the schematic structure of an EUV exposure apparatus according to the second embodiment of the present invention, while enlarging the vicinity of a fifth mirror 6 of a projection optical system.

In this embodiment, helium is supplied to a space between a partition 64 and a wafer 21. The gas is supplied during exposure as in the first embodiment.

A gas supply nozzle 43 is arranged near the exposure region on the wafer surface. The supplied helium partially flows into a second optical path space 93, as in the first embodiment, and is exhausted by an exhauster 36. Another part of the helium flows outward from the center of the exposure region to a wafer stage space 95 and is exhausted by the exhauster 36. With this arrangement, the concentration of the inert gas in the space (to be referred to as a sensor space hereinafter) defined between the partition 64 and the wafer surface can be increased. Entering the contaminants produced in the wafer stage space can be suppressed. It is possible to protect an exposure amount measurement sensor 51 arranged on a wafer stage 23 against the contamination. Note that the gas supply nozzle 43 preferably supplies the inert gas between the wafer and the partition, or between the partition and the sensor, or the like, arranged near the wafer.

Helium is supplied from a nozzle 41 to the second optical path space through a valve V1, and the supplied helium is partially exhausted by an exhauster 34, as in the first embodiment. Another part of the helium flows into the first optical path space via an aperture member 62, and a part thereof is exhausted by an exhauster 35 in an exhaust space 94 through an opening of a partition 63. At this time, the contaminants flowing from the wafer stage space 95 are pushed by the flow from the second optical path space 93 and recovered by the exhauster 35 in the exhaust space 94, without rarely entering into the second optical path space 93.

As described above, the exposure amount measurement sensor 51 can also be protected against the contaminants produced in the wafer stage space as opposed to the first embodiment. Similarly, the contaminants produced from the wafer during exposure can be suppressed from entering into the second optical path space.

Figure 3:
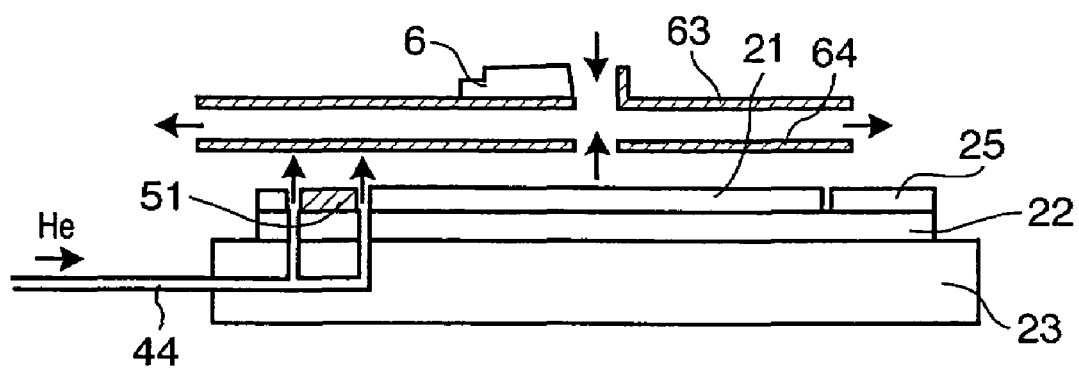
FIG. 3 is a view showing a structure in which a gas supply system is arranged near a sensor.
Figure 4:
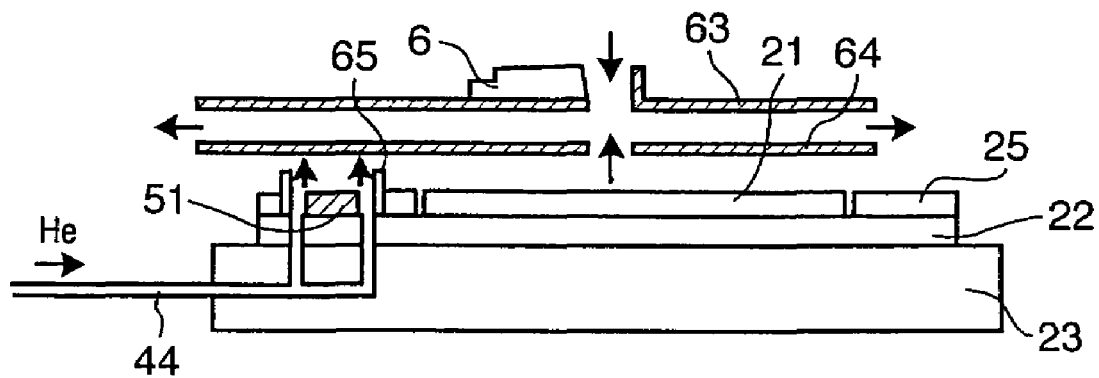
FIG. 4 is a view showing a structure in which partitions and the gas supply system are arranged near the sensor.

As shown in FIG. 3, when helium is supplied from around the exposure amount measurement sensor 51, the vicinity of the sensor can always be protected against the contamination by the high-concentration inert gas. As shown in FIG. 4, a partition 65 is arranged so as to surround the sensor 51, and helium is supplied from the inside, so that a further enhanced suppression effect can be obtained.

Figure 5:
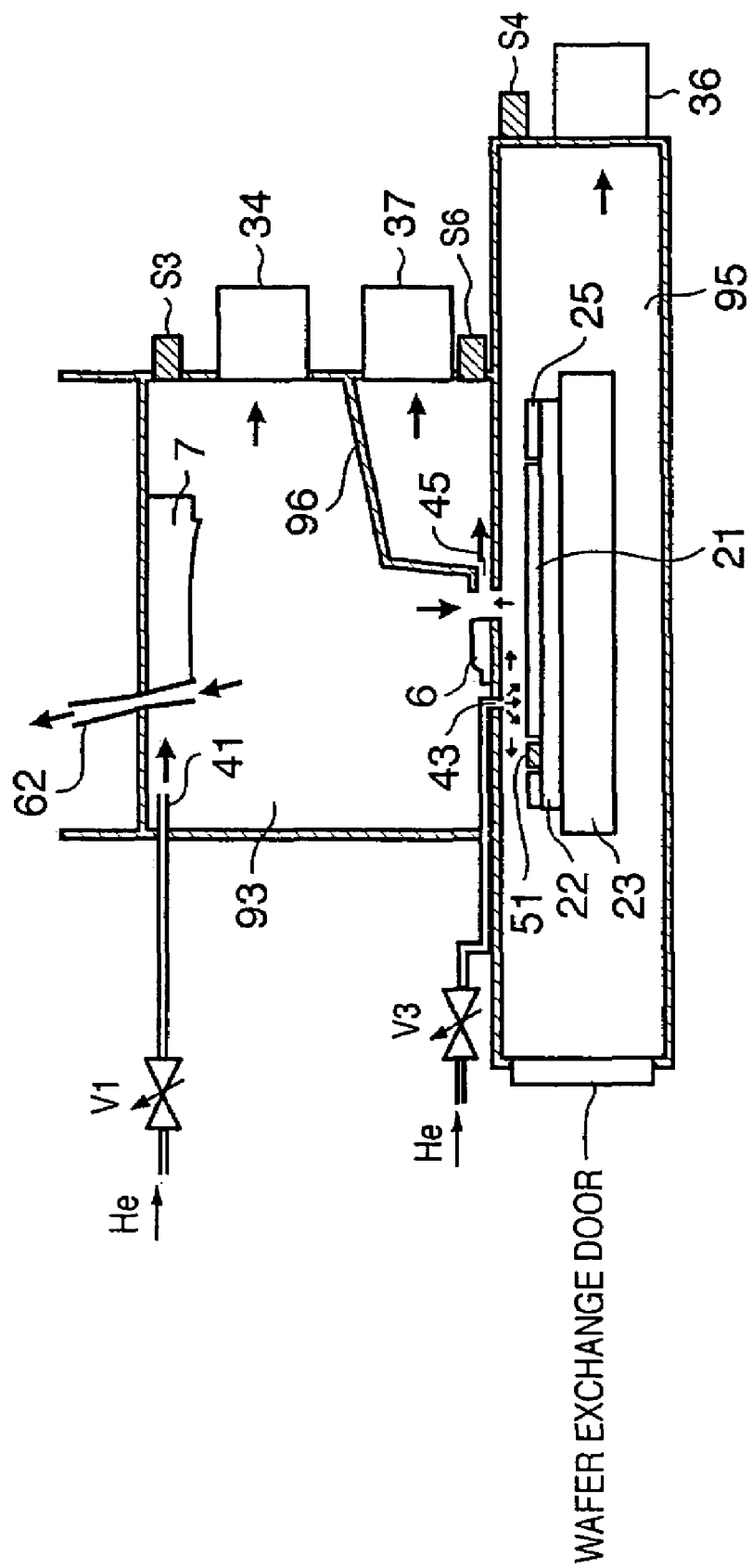
FIG. 5 is a view showing a structure in which an exhaust space is arranged beside the mirror.

As shown in FIG. 5, as compared with FIG. 1, an exhaust or evacuation space 96 is formed next to the fifth mirror 6 of the projection optical system, and the helium supplied to the wafer stage space 95 and the second optical path space 93 may be exhausted from the side of the fifth mirror 6 of the projection optical system.

Third Embodiment

Figure 6:
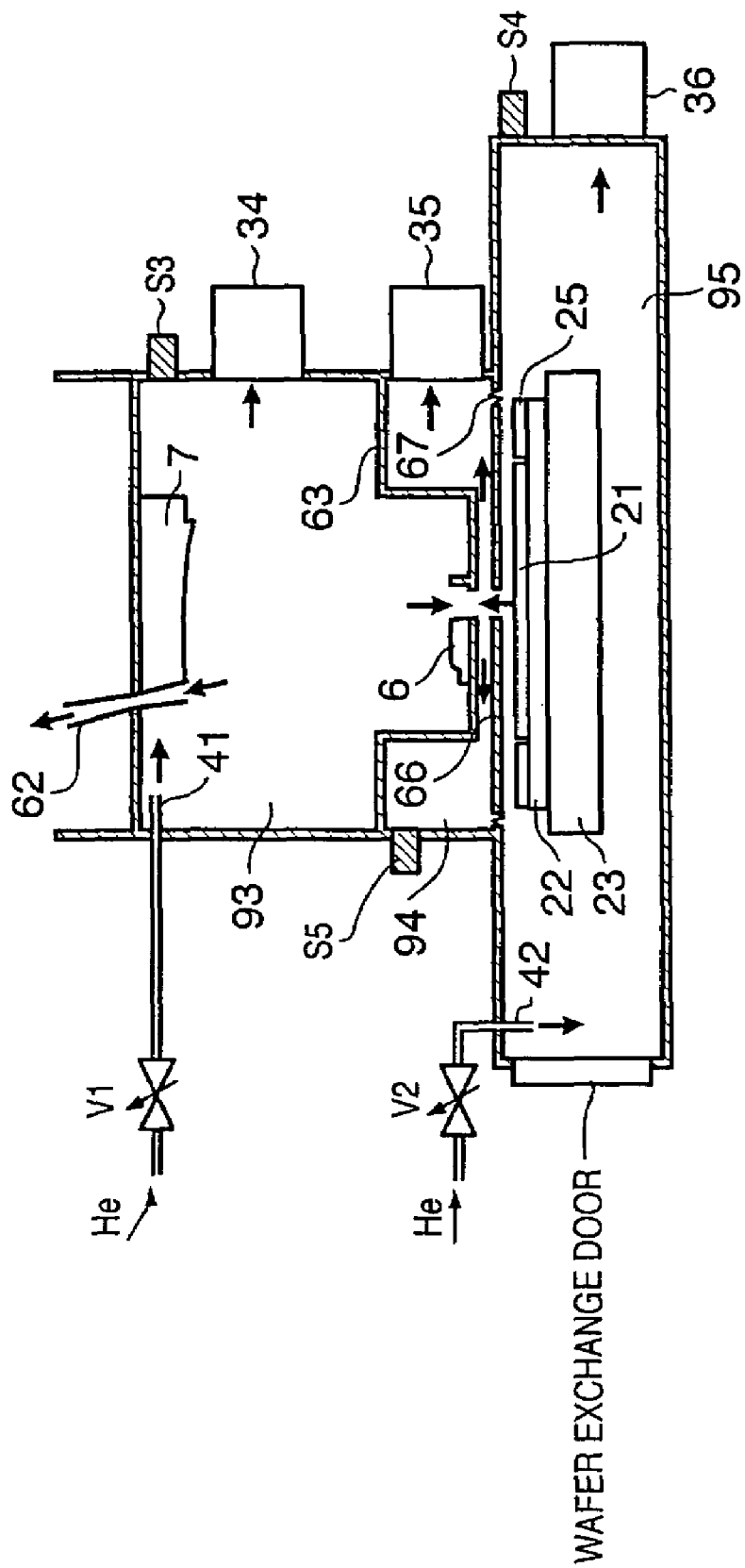
FIG. 6 shows the schematic structure of an EUV exposure apparatus according to the third embodiment of the present invention, while enlarging the vicinity of a fifth mirror of a projection optical system.

FIG. 6 is a view showing a schematic structure of an EUV exposure apparatus according to the third embodiment of the present invention. In place of the partition 64 in FIG. 1, a partition 66 having an opening through a connection member 67 made of a material, such as a resin or ceramic with a low heat conductance, is formed. The partition 66 is an opening member connected to a cooling mechanism (not shown) and arranged in a position opposing the wafer surface. The partition having the cooling mechanism is arranged on the wafer surface in FIG. 6, but a similar structure may be arranged on a reticle surface.

Each connection member is connected to a cooling mechanism (not shown), such as a cooling water pipe or Peltier element, and is cooled to a predetermined temperature. The temperature of a region of the wafer surface irradiated with exposure light rises by the exposure heat, and this region is heated to a temperature higher than that of the partition 66. For this reason, a temperature difference is produced between the partition 66 and the wafer surface during exposure. Since the reticle and wafer are always controlled to have the same temperature, it is possible to control the temperature of the wafer surface by the partition 66. Alternatively, the temperatures of the reticle and the wafer are independently controlled, and the temperature of the partition 66 may be set to a lower one of the set temperatures of the reticle and wafer.

An inert gas, such as He, having a high transmittance with respect to EUV light, is supplied to a wafer stage space 95 and a second optical path space 93 via valves V1 and V2, to control the pressure of each space to several Pa or more. With this arrangement, particles can be suppressed by heat migration. In addition, attaching particles onto the wafer surface can be suppressed by heat migration.

A similar structure may be arranged near the reticle to suppress particle attachment by heat migration.

Figure 7:
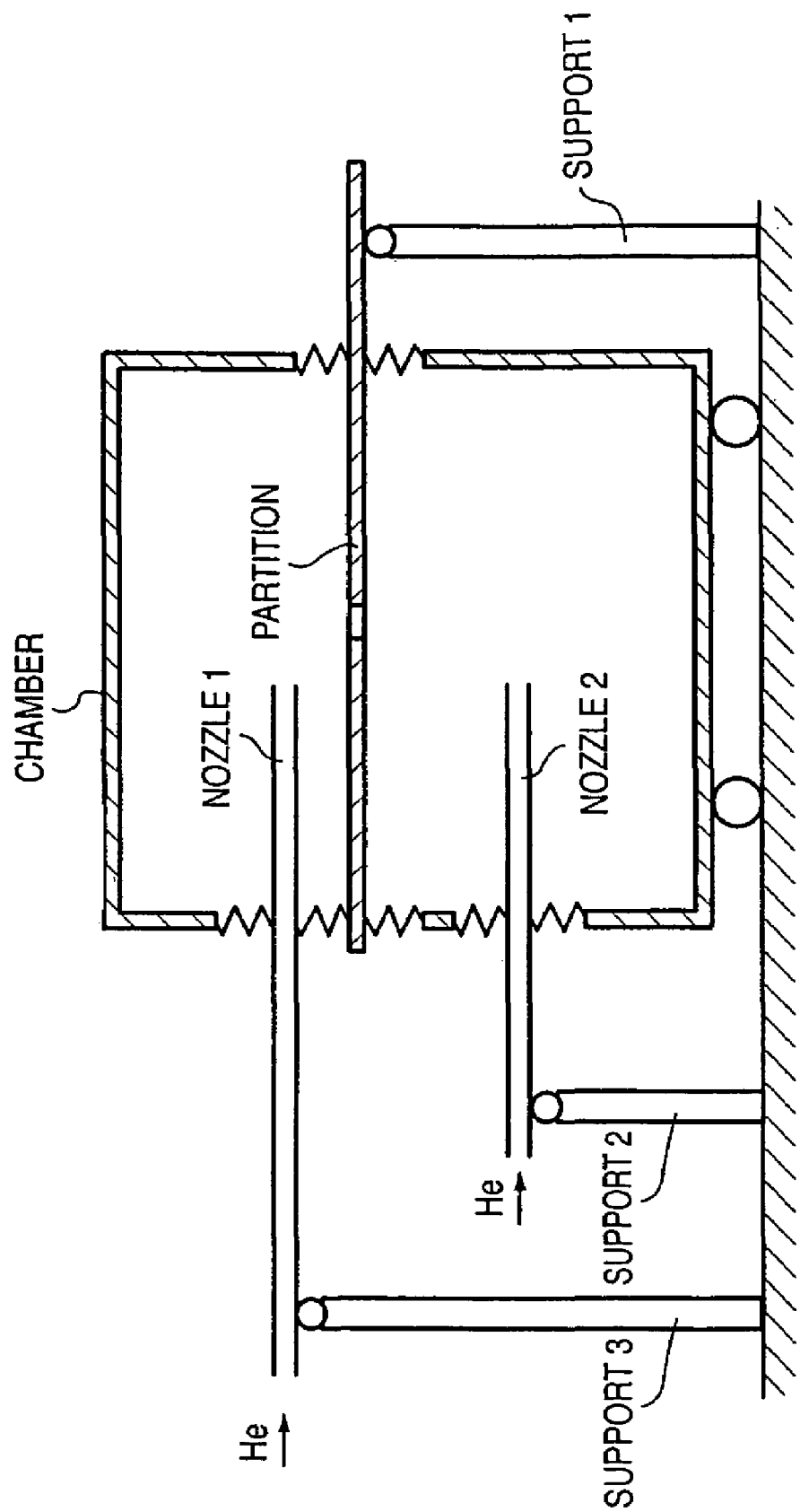
FIG. 7 is a view showing a modification of the third embodiment.

As shown in FIG. 7, the nozzle, which supplies helium, and the partition, having the opening for substantially separating the vessels, are held by different supports. Vibrations generated during gas supply can be suppressed.

In this embodiment, exposure is performed using EUV light. However, light is not limited to the EUV light. If an exposure apparatus performs exposure in a vacuum or high vacuum, this embodiment is applicable to it. This embodiment is also applicable to an exposure apparatus, which performs exposure using extreme ultraviolet light having a wavelength of 0.5 nm to 20 nm.

In the first to third embodiments, the chamber which surrounds the optical elements of the projection optical system is divided into two spaces (the first and second optical path spaces or the reticle chamber and wafer chamber). The chamber may be divided into three or more spaces.

Figure 8:
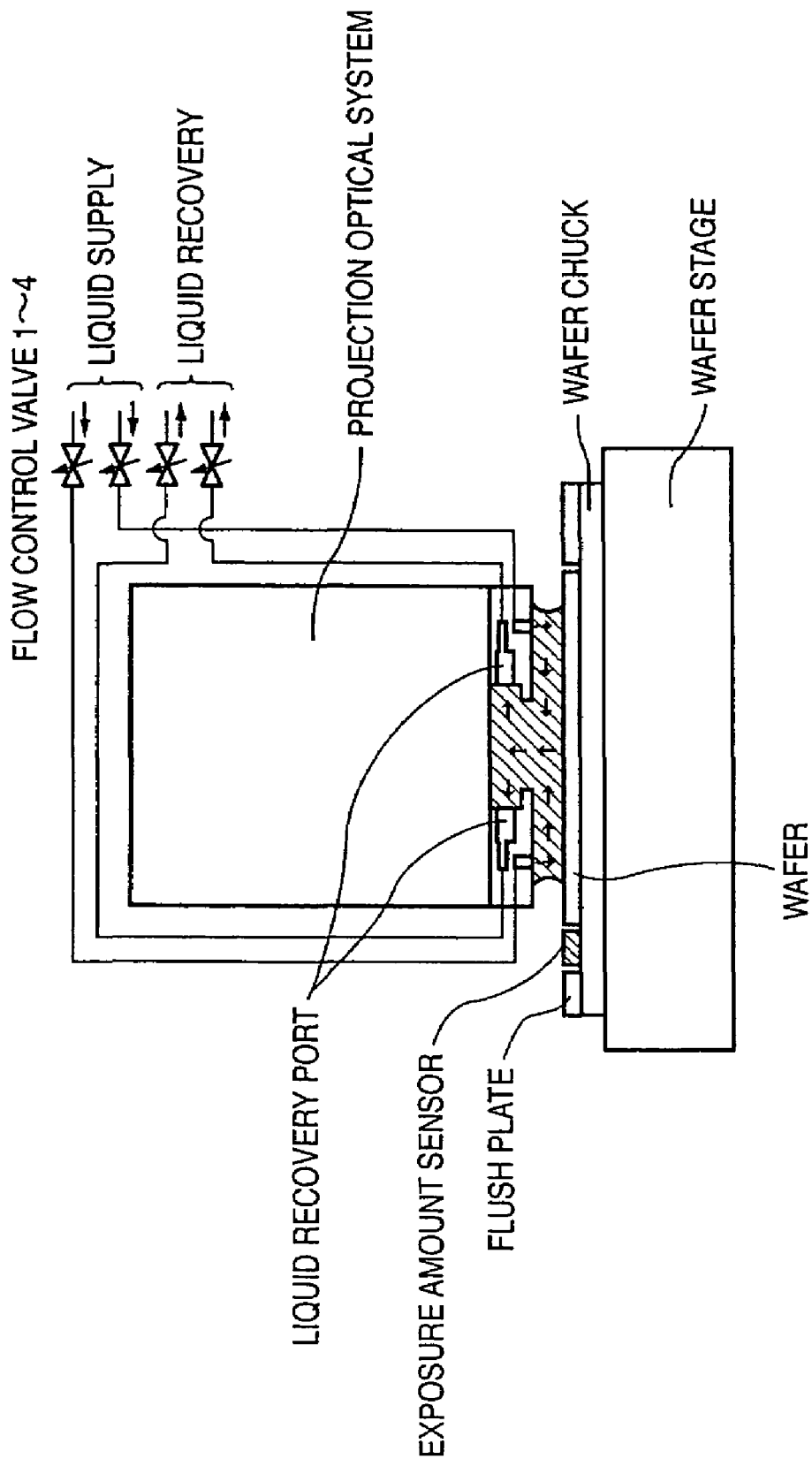
FIG. 8 is a view showing an example in which the present invention is applied to a liquid immersion exposure apparatus as a modification of the third embodiment.
Figure 9:
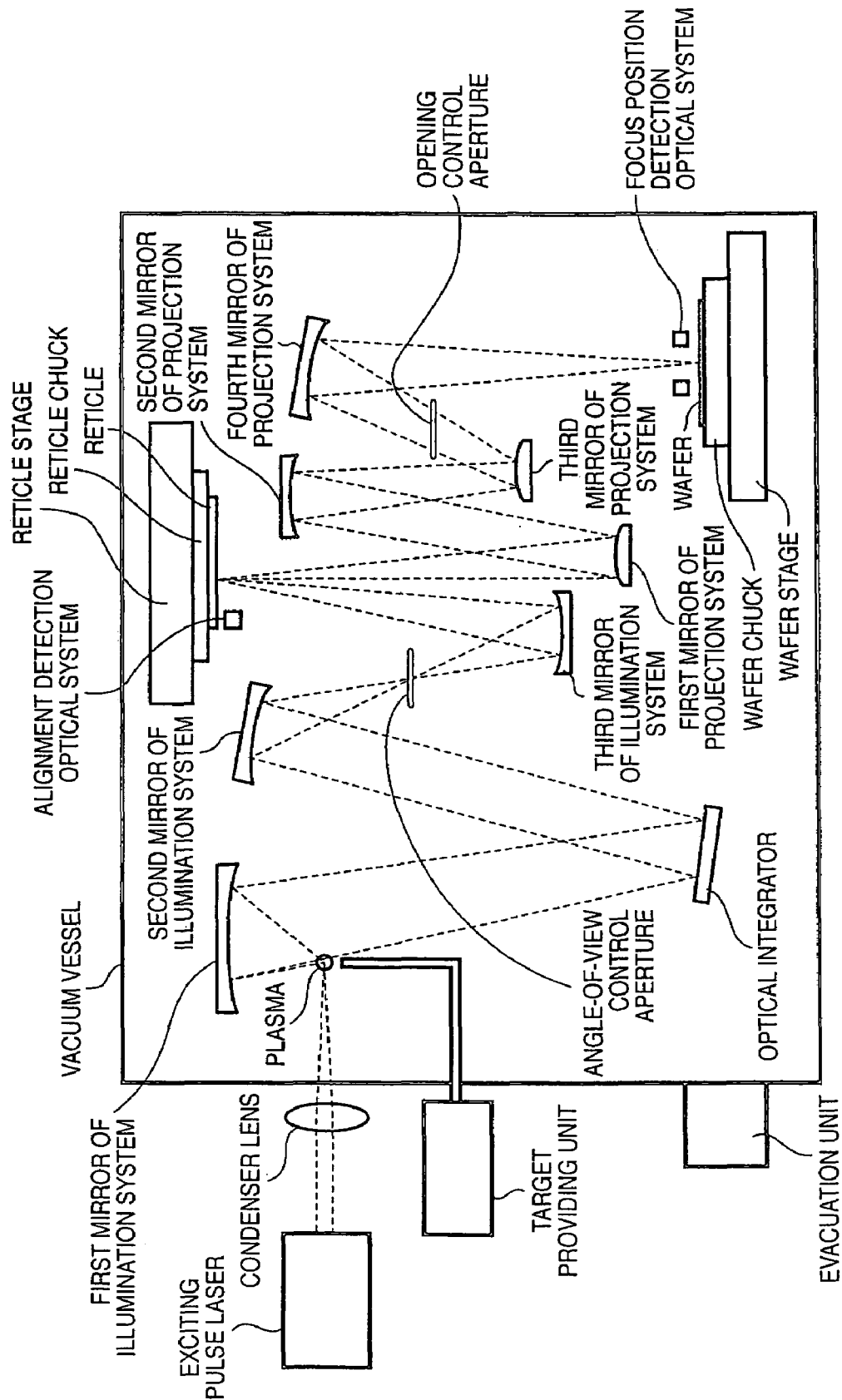
FIG. 9 is a view showing the schematic structure of a conventional EUV exposure apparatus.

Each embodiment described above has exemplified an exposure apparatus using EUV light. The present invention is also applicable to a liquid immersion exposure apparatus, as shown in FIG. 8. A cover with an opening is arranged between a wafer and a projection optical system, and a liquid supply port is formed below the cover to supply the liquid onto the wafer surface. The supplied liquid is recovered by a recovery port formed near the projection optical system through the opening, so that the present invention is also applicable to the liquid immersion exposure apparatus. In this case, since the stage is driven at high speed and the liquid is splashed around the stage, an air curtain (not shown) is arranged around the cover to stably supply or recover the liquid.

Fourth Embodiment

A device manufacturing method using the above-described exposure apparatus will be described next with reference to FIGS. 10 and 11.

Figure 10:
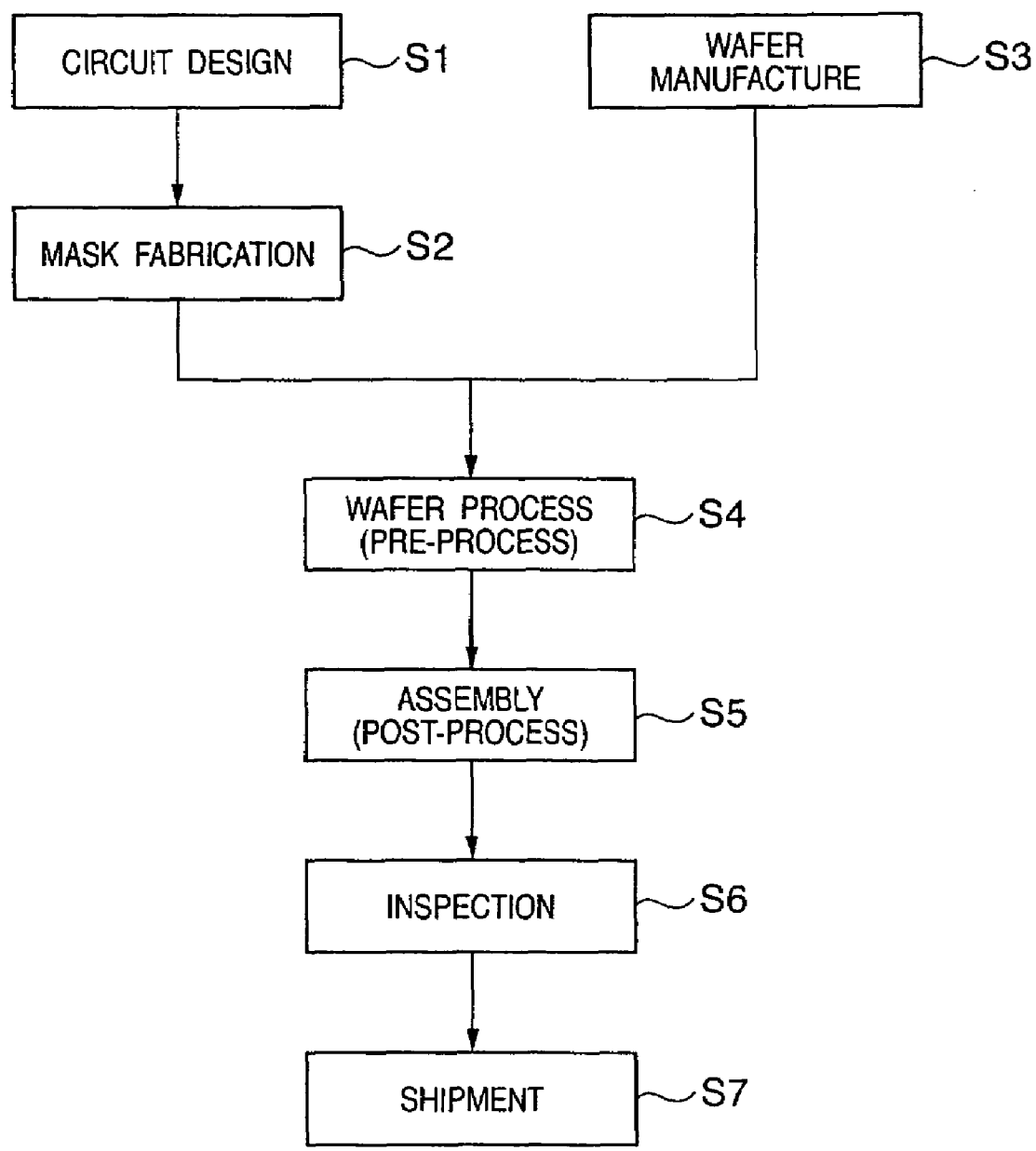
FIG. 10 is a flowchart for explaining a device manufacturing method.

FIG. 10 is a flowchart for explaining the manufacture of a device (e.g., a semiconductor chip, such as an IC or LSI, an LCD, or a CD). In this embodiment, the semiconductor chip manufacture will be exemplified. In step S1 (circuit design), a device circuit is designed. In step S2 (mask fabrication), a mask is fabricated on the basis of the designed circuit pattern. In step S3 (wafer manufacture), a wafer is manufactured using a material such as silicon. In step S4 (wafer process), called a pre-process, an actual circuit is formed on the wafer by lithography using the mask and wafer. In step S5 (assembly), called a post-process, a semiconductor chip is formed by using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped (step 7).

Figure 11:
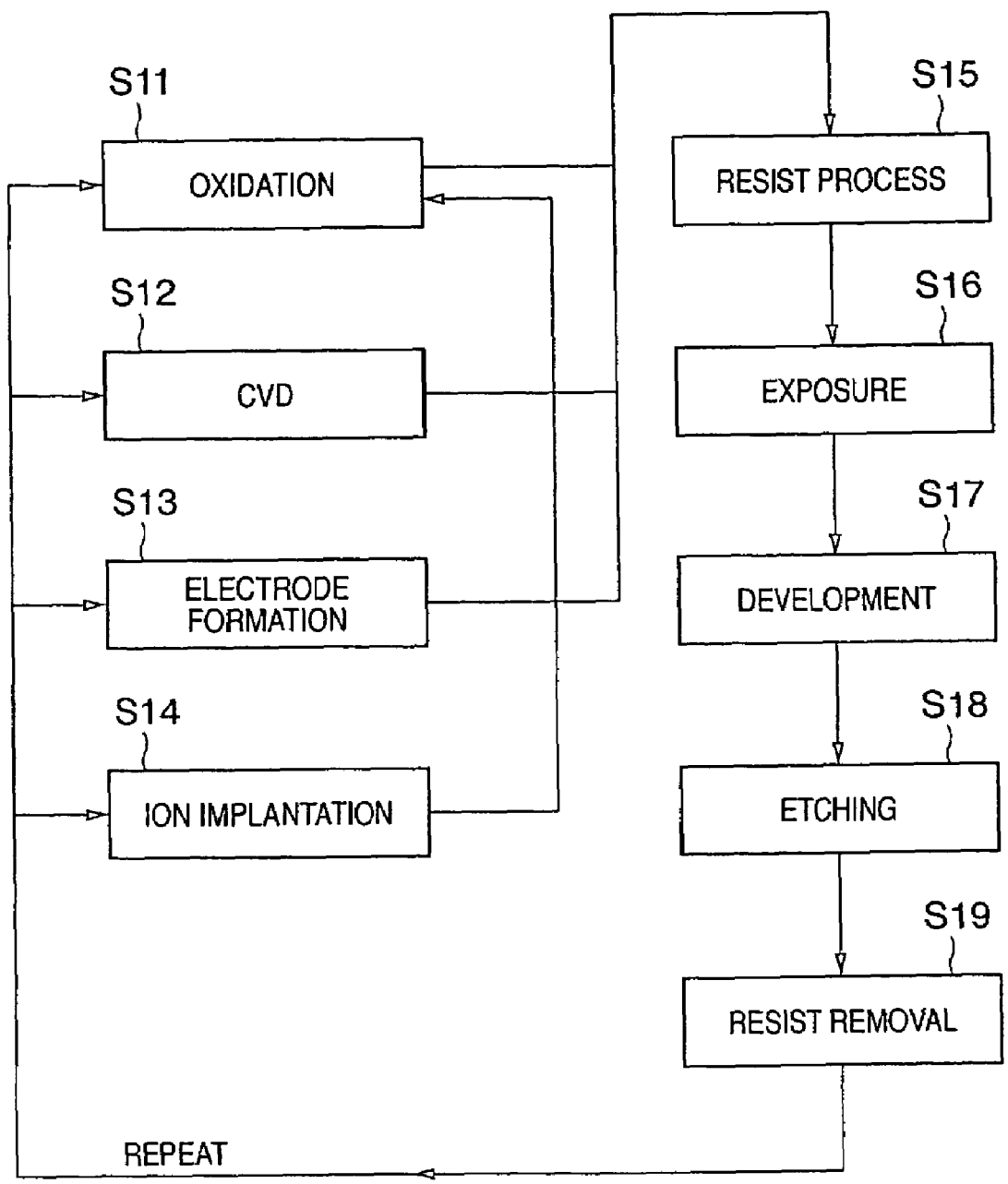
FIG. 11 is a flowchart showing details of the wafer process in step S4 of FIG. 10.

FIG. 11 is a flowchart showing details of the wafer process shown in step S4. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is supplied to the wafer. In step S16 (exposure), the above-described exposure apparatus is caused to expose the wafer via the mask. In step S17 (development), the exposed wafer is developed. In step S18 (etching), portions other than the developed resist image are etched. In step S19 (resist removal), any unnecessary resist remaining after etching is removed. These steps are repeated to form multiple circuit patterns on the wafer. The device manufacturing method of this embodiment makes it possible to manufacture a device with a quality higher than that in the prior art. In this way, one aspect of the present invention comprises the device manufacturing method using the exposure apparatus, and the device as a product.

Although the preferred embodiments of the present invention have been described above, the present invention can be practiced by arbitrarily combining the first to fourth embodiments.

In an exposure apparatus which performs exposure using EUV in a vacuum, the first and second optical path spaces 92 and 93, which accommodate the projection optical system, the space 91, which accommodates the reticle stage, and the space 95, which accommodates the wafer stage, are substantially separated from each other by the partitions 61 to 66 with openings. These openings provide the ability to guide and to move exposure light and gaseous molecules between the spaces. The exhaust space 94 with an exhaust port is formed between the wafer stage space 95 and the second optical path space 93, which accommodates the projection optical system, to supply an inert gas to the wafer stage space 95. An inert gas flow is formed from the wafer stage space 95 to the exhaust space 94. This flow allows recovery, in the exhaust space 94 through the openings, contaminants produced from the exposure region in the wafer stage space during exposure. This makes it possible not to attach the contaminants to the surface of the sensor arranged on the wafer stage to measure the exposure amount and light intensity distribution.

The inert gas is supplied to the inert gas destination in the wafer stage space 95, i.e., between the wafer and the partition 64. This makes it possible to prevent the contaminants produced in the wafer stage space 95 from entering the space between the wafer stage and the partition. The partial pressures of the contaminants can be kept low, and contamination of the sensor can be minimized.

As shown in FIG. 3, when the inert gas is supplied from the peripheral portion of the sensor arranged on the wafer stage, contamination of the surface of the sensor, which measures the exposure amount, and the exposure light intensity distribution can further be suppressed. As shown in FIG. 4, the partition 65, which surrounds the sensor, is formed around the sensor, and the inert gas is supplied from inside the partition, thereby suppressing contamination of the sensor surface.

The gas supply system, which supplies the inert gas to the second optical path space 93, which accommodates the projection optical system, is arranged so that the contaminants flowing from the wafer stage space 95 to the space on the projection optical system side can be promoted to flow into the exhaust space 94, thereby suppressing the contaminants from entering into the second optical path space 93. In addition, the contaminants can be recovered and exhausted by the exhaust space 94 formed between the space 93, which accommodates the projection optical system, and the space 95, which accommodates the wafer stage.

The partition 64 can movably be supported with respect to a vessel, which defines the spaces 93 and 95, and the nozzles 41 and 42, which supply the inert gas, are movably supported with respect to the vessel. The vibrations from the partition and the nozzles will not be transmitted to the vessel.

Providing the means for cooling the partition 66 allows suppression of particle attachment caused by heat migration.

The pressure of the second optical space 93, which accommodates the projection optical system, and the pressure of the wafer stage space 95, are preferably 0.1 to 10 Pa, in consideration of the transmittance of exposure light and the inert gas contamination suppression effect. In this case, it is preferable to control the amount of inert gas supplied to the wafer stage space 95, so as to keep its pressure almost constant. It is also preferable to control the amount of inert gas supplied to the second optical path space 93, so as to keep its pressure almost constant.

With the above arrangement, the variations in pressure caused by the change in conductance upon stage operation can be suppressed, the change in exposure light intensity can be suppressed, and the contamination of the sensor arranged on the wafer stage to measure the exposure amount can be suppressed.

As many apparently widely different embodiments of the present invention can be made without departing from the spirit and scope thereof, it is to be understood that the invention is not limited to the specific embodiments thereof, except as defined in the appended claims.

What is claimed is:

1. An exposure apparatus for exposing a substrate to light via a reticle in a vacuum atmosphere, said apparatus comprising:

a projection optical system configured to project a pattern of the reticle onto the substrate;
a stage configured to hold the substrate and to move;
first and second partitions configured to define an exhaust space between a first space which accommodates at least a part of said projection optical system and a stage space which accommodates said stage, said first partition including a first opening configured to make the light pass between the first space and the exhaust space, and said second partition including a second opening configured to make the light pass between the exhaust space and the stage space;
a first supply system configured to supply fluid into the stage space; and
a first exhaust system configured to recover fluid from the stage space through said second opening and the exhaust space,
wherein said first exhaust system is configured to set a pressure in the exhaust space to be lower than those in the first space and the stage space.

2. An apparatus according to claim 1, further comprising:
a reticle stage configured to hold the reticle and to move;
a third partition configured to partition a second space which accommodates at least a part of said projection optical system and a reticle stage space which accommodates said reticle stage, said third partition including a third opening configured to make the light pass between the second space and the reticle stage space; and
a second exhaust system configured to recover fluid from the reticle stage space through the third opening and the second space.

3. An apparatus according to claim 2, wherein said second exhaust system is configured to set a partial pressure of gas outgassed in the second space to be lower than a partial pressure of gas outgassed in the reticle stage.

4. An apparatus according to claim 2, further comprising a fourth partition configured to partition the first space and the second space, said fourth partition including a fourth opening configured to make the light pass between the first space and the second space.

5. An apparatus according to claim 4, wherein said second exhaust system is configured to set a pressure in the second space to be lower than that in the first space.

6. An apparatus according to claim 1, further comprising a first sensor configured to measure pressure in the stage space,
wherein said first supply system is configured to supply inert gas as the fluid so as to keep the pressure in the stage space constant based on measurement made by said first sensor.

7. An apparatus according to claim 6, further comprising a second sensor arranged on said substrate stage,
wherein said first supply system is configured to supply inert gas from a region which surrounds said second sensor.

8. An apparatus according to claim 7, further comprising a partition configured to surround said second sensor,
wherein said first supply system is configured to supply inert gas from a region between said partition and said second sensor.

9. An apparatus according to claim 1, wherein said first supply system is configured to supply inert gas into a gap between said second partition and said substrate stage.

10. An apparatus according to claim 1, wherein a pressure in the stage space is higher than 0.1 Pa and lower than 10 Pa.

11. An apparatus according to claim 1, wherein a pressure in the first space is higher than 0.1 Pa and lower than 10 Pa.

12. An apparatus according to claim 1, wherein said first supply system is configured to supply inert gas as the fluid.

13. An apparatus according to claim 8, further comprising a second supply system configured to supply inert gas into the first space.

14. An apparatus according to claim 13, further comprising a third sensor configured to measure pressure in the first space,
wherein said second supply system is configured to supply the inert gas so as to keep the pressure in the first space constant based on measurement made by said third sensor.

15. An apparatus according to claim 1, further comprising:
a chamber configured to define each of the spaces; and
a first support configured to support said second partition substantially independently of said chamber.

16. An apparatus according to claim 1, further comprising:
a chamber configured to define each of the spaces; and
a second support configured to support said first supply system substantially independently of said chamber.

17. An apparatus according to claim 1, further comprising a cooling mechanism configured to cool said second partition.

18. An apparatus according to claim 1, wherein a wavelength of the light is not shorter than 0.5 nm and not longer than 20 nm.

19. A method of manufacturing a device, said method comprising steps of:
exposing a substrate to light via a reticle using an exposure apparatus as defined in claim 1;
developing the exposed substrate; and
processing the developed substrate to manufacture the device.

* * * * *